(12) United States Patent
Luo

(10) Patent No.: US 12,119,356 B2
(45) Date of Patent: Oct. 15, 2024

(54) DRIVER BOARD, DISPLAY PANEL

(71) Applicant: Shenzhen China Star Optoelectronics Semiconductor Display Technology Co., Ltd., Shenzhen (CN)

(72) Inventor: Chuanbao Luo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/620,807

(22) PCT Filed: Dec. 8, 2021

(86) PCT No.: PCT/CN2021/136584
§ 371 (c)(1),
(2) Date: Dec. 20, 2021

(87) PCT Pub. No.: WO2023/092659
PCT Pub. Date: Jun. 1, 2023

(65) Prior Publication Data
US 2024/0030240 A1    Jan. 25, 2024

(30) Foreign Application Priority Data
Nov. 24, 2021   (CN) .......................... 202111418670.1

(51) Int. Cl.
*H01L 27/12* (2006.01)
*H10K 59/80* (2023.01)

(52) U.S. Cl.
CPC ..... *H01L 27/1248* (2013.01); *H10K 59/8731* (2023.02)

(58) Field of Classification Search
None
See application file for complete search history.

(56) References Cited

U.S. PATENT DOCUMENTS

2003/0017297 A1* 1/2003 Song .................... H10K 50/844
428/76
2006/0006794 A1* 1/2006 Sakakura ........... H10K 59/8052
313/503
(Continued)

FOREIGN PATENT DOCUMENTS

CN      101908489 A     12/2010
CN      103715264 A     4/2014
(Continued)

OTHER PUBLICATIONS

Chinese Office Action issued in corresponding Chinese Patent Application No. 202111418670.1 dated May 31, 2024, pp. 1-6.

*Primary Examiner* — Evren Seven
(74) *Attorney, Agent, or Firm* — PV IP PC; Wei Te Chung

(57) ABSTRACT

The application provides a driver board and a display panel; the driver board comprises a substrate, a metal oxide semiconductor active layer, a gate layer, and a first protective layer; the gate layer is arranged on the side of the metal oxide semiconductor active layer away from the substrate, the first protective layer covers the gate layer, the material of the first protective layer is metal oxide semiconductor, and the oxygen content of the first protective layer is greater than the oxygen content of the metal oxide semiconductor active layer. The first protective layer in the driver board of the present application could block water vapor in the environment, so as to improve the transistor performance.

14 Claims, 9 Drawing Sheets

(56) References Cited

U.S. PATENT DOCUMENTS

| | | | |
|---|---|---|---|
| 2013/0249877 A1* | 9/2013 | Choi | H01L 27/1262 345/205 |
| 2015/0357480 A1 | 12/2015 | Yu | |
| 2021/0210516 A1* | 7/2021 | Wang | H01L 27/1222 |
| 2022/0005956 A1* | 1/2022 | Chen | H01L 29/78693 |

FOREIGN PATENT DOCUMENTS

| | | |
|---|---|---|
| CN | 105552128 A | 5/2016 |
| CN | 107195688 A | 9/2017 |
| CN | 111244110 A | 6/2020 |
| CN | 112038289 A | 12/2020 |
| KR | 20200061797 A | 6/2020 |

* cited by examiner

DRIVER BOARD, DISPLAY PANEL

CROSS-REFERENCE TO RELATED APPLICATION

This application is a national phase application under 35 U.S.C. § 371 of PCT Application No. PCT/CN2021/136584, filed Dec. 8, 2021, which claims priority to Chinese Application No. 202111418670.1, filed Nov. 24, 2021, the contents of which are incorporated herein by reference in their entirety.

FIELD OF INVENTION

The present application relates to the field of display technology, and in particular to a driver board and a display panel.

BACKGROUND OF INVENTION

With the rapid development of display technology, the Top Gate Thin Film Transistor (Top Gate TFT) backplane technology is often used as the preferred technology for Mini/Micro LED (MLED) display panels because of unique advantages such as good stability, low parasitic capacitance, and narrow channels.

However, in the current low temperature polycrystalline oxide (LTPO) process, there is a poor performance issue of the transistor due to the negative drift of the device; on the one hand, active layer semiconductor materials with high mobility have higher Fermi energy levels, and water vapor in the environment can penetrate through inorganic membranes such as silicon oxide to provide electrons as donors, resulting in device negative-drift; and, on the other hand, metal oxides with high mobility generally have a band gap of less than 2.0 eV, which is more sensitive to light, so would cause device negative-drift easily.

Therefore, it is necessary to provide a driver board to reduce the negative drift of the device, thereby improving the performance of the transistor.

The embodiment of the present application provides a driver board and a display panel, which are used to reduce the device negative drift, improving the performance of the transistor.

SUMMARY OF INVENTION

The application provides a driver board, which comprises a substrate, a metal oxide semiconductor active layer, a gate layer, and a first protective layer. Wherein, the gate layer is arranged on the side of the metal oxide semiconductor active layer away from the substrate, the first protective layer covers the gate layer, the material of the first protective layer is metal oxide semiconductor, and the oxygen content of the first protective layer is greater than the oxygen content of the metal oxide semiconductor active layer.

The driver board of the present application further comprises a source-drain layer and a second protective layer. The source-drain layer is arranged on the side of the first protection layer away from the gate layer, the second protective layer covers the source-drain layer, the material of the second protective layer is metal oxide semiconductor, and the oxygen content of the second protective layer is greater than the oxygen content of the metal oxide semiconductor active layer.

The driver board of the present application further comprises a third protective layer and a passivation layer. The passivation layer is arranged on the side of the second protection layer away from the source-drain layers, the third protective layer covers the passivation layer, and the oxygen content of the third protective layer is greater than the oxygen content of the metal oxide semiconductor active layer.

In the driver board of the present application, the third protective layer comprises a first protective sublayer, a second protective sublayer, and a third protective sublayer, which are stacked. The materials of the first protective sublayer and the third protective sublayer are metal oxide semiconductors, the oxygen content of the first protective sublayer and the third protective sublayer is greater than the oxygen content of the metal oxide semiconductor active layer, and the material of the second protective sublayer is an inorganic material.

In the driver board of the present application, the band gap of the metal oxide semiconductor of the at least one protective layer is 2.0 eV to 3.5 eV.

In the driver board of the present application, the sheet resistance of the metal oxide semiconductor of at least one protective layer is equal to or more than 10 to the power of 9 ($10^9$) $\Omega \cdot cm^{-2}$.

In the driver board of the present application, the thickness of the metal oxide semiconductor of at least one protective layer is 10 nm to 30 nm.

In the driver board of the present application, the metal oxide semiconductor of at least one protective layer is an opaque material.

In the driver board of the present application, the material of the metal oxide semiconductor of each protective layer includes one or more of indium gallium zinc oxide, indium zinc tin oxide, and indium gallium zinc tin oxide.

In the driver board of the present application, a pixel electrode layer is arranged on the side of the passivation layer away from the substrate, and the film material of the pixel electrode layer is a high-permeability metal oxide material.

The application also provides a display panel with a driver board and a light source. The driver board comprises a substrate, a metal oxide semiconductor active layer, a gate layer, and a first protective layer. Wherein, the gate layer is arranged on the side of the metal oxide semiconductor active layer away from the substrate, the first protective layer covers the gate layer, the material of the first protective layer is metal oxide semiconductor, and the oxygen content of the first protective layer is greater than the oxygen content of the metal oxide semiconductor active layer.

The display panel of the present application further comprises a source-drain layer and a second protective layer. The source-drain layer is arranged on the side of the first protection layer away from the gate layer, the second protective layer covers the source-drain layer, the material of the second protective layer is metal oxide semiconductor, and the oxygen content of the second protective layer is greater than the oxygen content of the metal oxide semiconductor active layer.

The display panel of the present application further comprises a third protective layer and a passivation layer. The passivation layer is arranged on the side of the second protection layer away from the source-drain layers, the third protective layer covers the passivation layer, and the oxygen content of the third protective layer is greater than the oxygen content of the metal oxide semiconductor active layer.

In the display panel of the present application, the third protective layer comprises a first protective sublayer, a second protective sublayer, and a third protective sublayer, which are stacked. The materials of the first protective sublayer and the third protective sublayer are metal oxide semiconductors, the oxygen content of the first protective sublayer and the third protective sublayer is greater than the oxygen content of the metal oxide semiconductor active layer, and the material of the second protective sublayer is an inorganic material.

In the display panel of the present application, the band gap of the metal oxide semiconductor of the at least one protective layer is 2.0 eV to 3.5 eV.

In the display panel of the present application, the sheet resistance of the metal oxide semiconductor of at least one protective layer is equal to or more than 10 to the power of 9 ($10^9$) $\Omega \cdot cm^{-2}$.

In the display panel of the present application, the thickness of the metal oxide semiconductor of at least one protective layer is 10 nm to 30 nm.

In the display panel of the present application, the metal oxide semiconductor of at least one protective layer is an opaque material.

In the display panel of the present application, the material of the metal oxide semiconductor of each protective layer includes one or more of indium gallium zinc oxide, indium zinc tin oxide, and indium gallium zinc tin oxide.

In the display panel of the present application, a pixel electrode layer is arranged on the side of the passivation layer away from the substrate, and the film material of the pixel electrode layer is a high-permeability metal oxide material.

The application provides a driver board and a display panel; the driver board comprises a substrate, a metal oxide semiconductor active layer, a gate layer, and a first protective layer; the gate layer is arranged on the side of the metal oxide semiconductor active layer away from the substrate, the first protective layer covers the gate layer, the material of the first protective layer is metal oxide semiconductor, and the oxygen content of the first protective layer is greater than the oxygen content of the metal oxide semiconductor active layer. The driver board of the present application is provided with a first protective layer, which material is a metal oxide semiconductor. Due to the compactness, metal oxide semiconductors can be used as the water vapor barrier layer of the metal oxide semiconductor active layer, effectively blocking the water vapor in the environment from penetrating through the inorganic film in the driver board. At the same time, the oxygen content of the first protective layer is greater than the oxygen content of the metal oxide semiconductor active layer, so as to further determine the insulating properties of the first protective layer, to reduce the device negative-drift and to improve the transistor performance.

DESCRIPTION OF DRAWINGS

The specific implementations of the present application will be described in detail below in conjunction with the accompanying drawings, so that the technical solutions and other beneficial effects of the present application can be more easily understood.

DETAILED DESCRIPTION OF EMBODIMENTS

Figure 1:
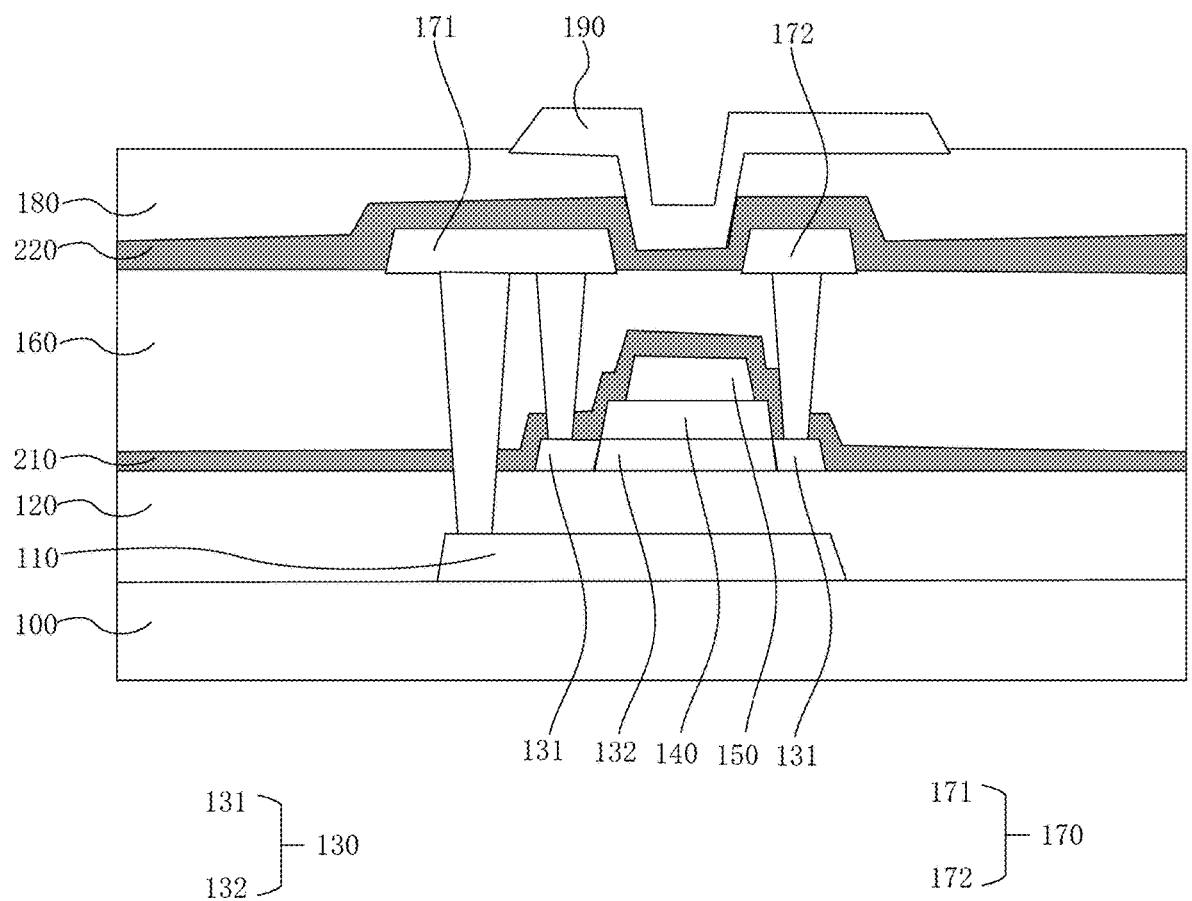
FIG. 1 is a schematic diagram of a structure of a driver board provided by an embodiment of the application.

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of the claims of this application.

In the description of this application, it needs to be understood that orientation or positional relationship terms "center", "vertical", "horizontal", "length", "width", "thickness", "upper", "lower", "front", "rear", "left", "right", "vertical", "horizontal", "top", "bottom", "inner", "outer", "clockwise", and "counterclockwise" are based on the orientation or position shown in the drawings relation, they are only for the convenience of describing the application and simplifying the description, rather than indicating or implying that the device or element referred to must have a specific orientation, be configured and operated in a specific orientation, and therefore cannot be understood as a limitation of the application. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "a plurality of" means two or more than two, unless otherwise specifically defined.

In the description of this application, it should be noted that the terms "installation", "connected" and "connected" should be understood in a broad sense, unless otherwise clearly specified and limited. For example, it can be a fixed connection, a detachable connection, or an integral connection; it can be a mechanical connection, an electrical connection, or mutual communication; it can be directly connected, or indirectly connected through an intermediate medium; and it can be a communication between two elements or an interaction relationship between two elements. For those of ordinary skill in the art, the specific meanings of the above terms in this application can be understood according to specific circumstances.

In this application, unless expressly stipulated and limited otherwise, the first feature is "on" or "under" the second feature means first and second features directly contact or indirectly contact through another feature between them; moreover, the first feature is "above" the second feature means the first feature being directly above or obliquely above the second feature, or merely indicating that the level of the first feature is higher than that of the second feature; and the first feature is "below" the second feature means the first feature directly below or obliquely below the second feature, or simply means that the level of the first feature is smaller than the second feature.

The following disclosure provides many different embodiments or examples for realizing different structures of the present application. In order to simplify the disclosure of the present application, the components and settings of specific examples are described below. Obviously, they are only examples, and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the application of other processes and/or the use of other materials.

The embodiment of the present application provides a driver board and a display panel, which are used to reduce the device negative-drift and to improve the transistor performance.

The FIG. 1 is a schematic diagram of the first structure of a driver board provided by an embodiment of this application. The structure of the driver board shown in FIG. 1 can be regarded as a double-layer metal oxide semiconductor solution; the driver board comprises a substrate 100, a metal oxide semiconductor active layer 130, a gate layer 150, and a first protective layer 210; wherein, the gate layer 150 is arranged on the side of the metal oxide semiconductor active layer 130 away from the substrate 100, the first protective layer 210 covers on the gate layer 150, the material of the first protective layer 210 is metal oxide semiconductor, and the oxygen content of the first protective layer 210 is greater than the oxygen content of the metal oxide semiconductor active layer 130.

Optionally, the substrate 100 may be a rigid substrate or a flexible substrate; when the substrate 100 is a rigid substrate, it may include a rigid substrate such as a glass substrate; when the substrate 100 is a flexible substrate, it may include a flexible substrate such as a polyimide (PI) film, an ultra-thin glass film, etc. The substrate 100 of the flexible substrate can be used to manufacture a flexible display panel to achieve special properties such as bending and curling of the display panel. The metal oxide semiconductor active layer 130 is subjected to plasma treatment to form the doped region 131 and the channel region 132 of the thin film transistor respectively.

A light shielding layer 110 and a buffer layer 120 may also be provided between the substrate 100 and the metal oxide semiconductor active layer 130. Wherein, the light shielding layer 110 is provided on the side of the substrate 100; preferably, the material of the light shielding layer 110 includes one or more alloys of molybdenum (Mo), aluminum (Al), copper (Cu), and titanium (Ti), and also includes a molybdenum/copper laminate (Mo/Cu), Molybdenum titanium alloy/copper laminate (MoTi/Cu), etc. The buffer layer 120 is arranged on the side of the light shielding layer 110 away from the substrate 100; the film material of the buffer layer 120 can be inorganic materials such as silicon oxide (SiOx), silicon nitride (SiNx), silicon oxynitride (SiON), or silicon nitride/silicon oxide stack (SiNx/SiOx), etc. so that the buffer layer 120 can prevent undesirable impurities or contaminants (such as moisture, oxygen, etc.) from diffusing from the substrate 100 into devices that may be damaged by these impurities or contaminants and can also provide a flat top surface.

A gate insulating layer 140 can also be provided between the metal oxide semiconductor active layer 130 and the gate layer 150, and the gate insulating layer 140 is provided on the side of the metal oxide semiconductor active layer 130 away from the substrate 100. Wherein, the material of the gate insulating layer 140 includes silicon oxide (SiOx), silicon nitride (SiNx), or a composite film formed by alternately stacking silicon oxide and silicon nitride; the material of the gate layer 150 includes one or more alloys of molybdenum (Mo), aluminum (Al), copper (Cu), and titanium (Ti). The gate layer 150 can be patterned to form gates and scan lines, and the first protection layer 210 covers the gates and scan lines. Specifically, the first protective layer 210 is made of a metal oxide semiconductor material, and its oxygen content is higher than that of the metal oxide semiconductor active layer 130. Wherein, due to the higher Fermi level, the active layer semiconductor materials with high mobility could be penetrated through inorganic membranes, such as silicon oxide, by water vapor in the environment as electron donors; however, the metal oxide semiconductor can prevent water vapor in the environment from penetrating through inorganic films such as silicon oxide in the active layer semiconductor materials due to compactness, thus, the first protective layer can be used as a water vapor barrier layer of the metal oxide semiconductor active layer 130. At the same time, since the material of the first protective layer is the same as the material of the metal oxide semiconductor active layer 130, both are metal oxide semiconductors, the first protective layer can absorb part of the light reflected by the grid, thereby reducing the optical fiber irradiated to the metal oxide semiconductor active layer 130 and reducing the influence of external light on the metal oxide semiconductor active layer 130. Moreover, due to the high oxygen content of the first protective layer 210, the insulating properties of the first protective layer are further ensured, so as to reduce the device negative drift and to improve the transistor performance.

In an embodiment, the driver board further includes a source-drain layer 170 and a second protection layer 220. Wherein, the source-drain layer 170 is arranged on the side of the first protection layer 210 away from the gate layer 150, the second protective layer covers the source-drain layer 170, the material of the second protection layer 220 is a metal oxide semiconductor, and the oxygen content of the second protective layer 220 is greater than the oxygen content of the metal oxide semiconductor active layer 130.

Specifically, an interlayer insulating layer 160 is also arranged on the side of the gate layer 150 away from the substrate 100. Wherein, the interlayer insulating layer 160 covers the first protective layer 210, and the material of the interlayer insulating layer 160 may be silicon oxide (SiOx), or an inorganic material such as a silicon nitride/silicon oxide stack (SiNx/SiOx).

Specifically, the source-drain layer 170 is arranged on the side of the interlayer insulating layer 160 away from the substrate 100. Wherein, the second protection layer 220 covers the source-drain layer 170, the source-drain layer 170 may be made of molybdenum (Mo), molybdenum/copper laminate (Mo/Cu), molybdenum titanium alloy/copper laminate (MoTi/Cu) etc., the source-drain layer 170 is patterned to form a source electrode 171 and a drain electrode 172, the second protective layer 220 is made of a metal oxide semiconductor material, and oxygen content of the second protective layer 220 is greater than that of the metal oxide semiconductor active layer 130. Wherein, when copper metal is used as the source-drain layer 170, corrosion often occurs under high temperature and high humidity conditions, so as to increase wiring resistance and even to result short circuits; however, metal oxide semiconductors can block the penetration of water vapor in the environment due to compactness, and thus serve as an anti-corrosion layer for source and drain metals. At the same time, since the material of the second protective layer is the same as that of the metal oxide semiconductor, both are metal oxide semiconductors, the second protective layer can absorb part of the optical fiber reflected by the LED and absorb the components of the light that have a greater influence on the oxide, thereby reducing the light irradiated to the first protective layer 210. After the second protection layer 220 and the first protection layer 210 absorb the external light twice, the light and the influence of the light irradiated to the metal oxide semiconductor active layer 130 can be greatly reduced; moreover, due to the high oxygen content of the second protective layer 220, the insulating properties of the second protective layer are further improved, and the protective effect of the active layer is further enhanced.

Specifically, a passivation layer 180 is further arranged on the side of the second protection layer 220 away from the substrate 100. Wherein, the film material of the passivation layer 180 can be silicon oxide (SiOx), silicon nitride/silicon oxide stack (SiNx/SiOx), or a stack of silicon oxide (SiOx), oxynitride (SiNx) and aluminum oxide ($Al_2O_3$).

Wherein, a pixel electrode layer 190 is arranged on the side of the passivation layer 180 away from the substrate. The film material of the pixel electrode layer 190 may be a high-transmittance metal oxide material such as indium tin oxide (ITO) or indium zinc oxide (IZO), and the pixel electrode layer 190 is patterned to form an anode Pad, so that display elements such as OLED or Mini/Micro-LED can be made on the Pad.

Figure 2:
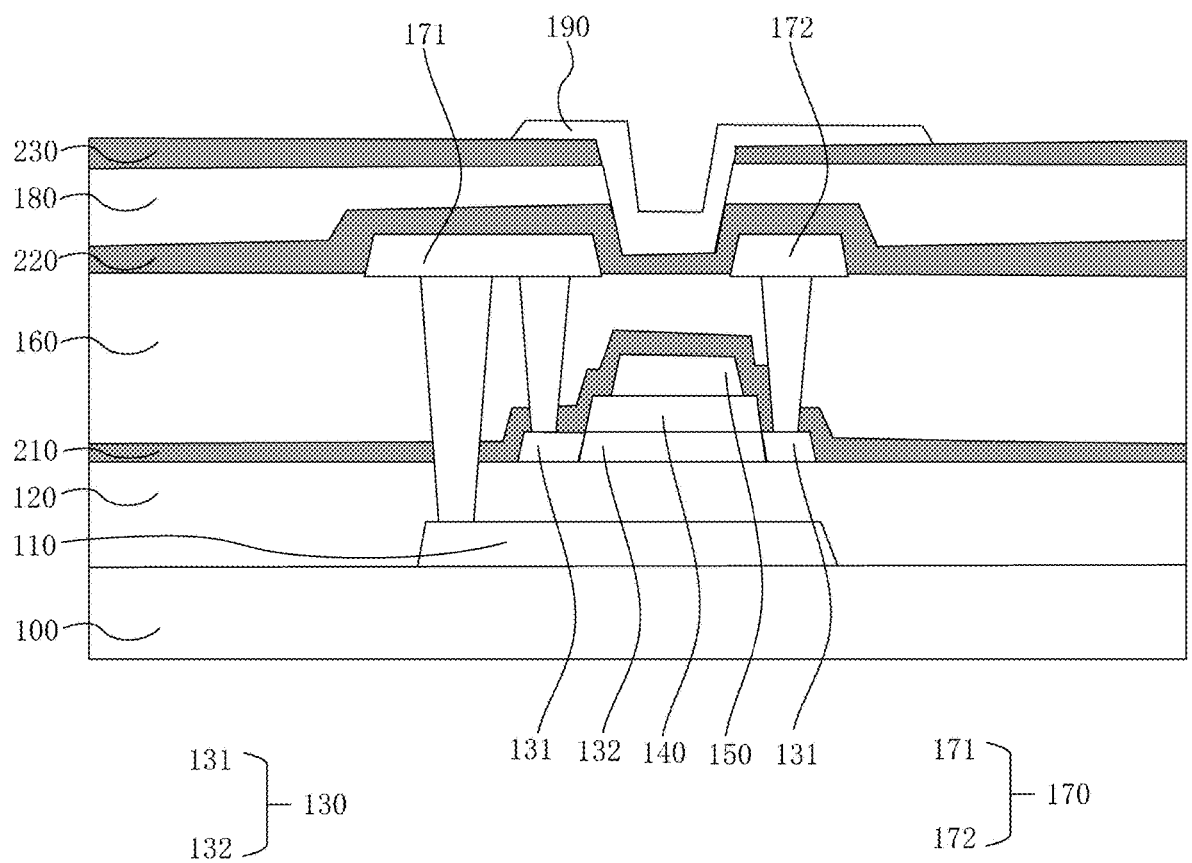
FIG. 2 is a schematic diagram of another structure of a driver board provided by an embodiment of the application.

In an embodiment, as shown in FIG. 2, FIG. 2 is a schematic diagram of another structure of the driver board provided by an embodiment of the application. The structure of the driver board shown in FIG. 2 can be regarded as a three-layer metal oxide semiconductor solution. In addition to the structure shown in FIG. 1, the driver board of FIG. 2 further includes a third protective layer 230 and a passivation layer 180. Wherein, the passivation layer 180 is arranged on the side of the second protective layer 220 away from the source-drain layer 170, the third protective layer 230 covers the passivation layer 180, the oxygen content of the third protective layer 230 is greater than the oxygen content of the metal oxide semiconductor active layer 130. Wherein, with higher oxygen content, the third protective layer ensures the insulating properties of the third protective layer.

In an embodiment, the third protective layer includes a first protective sublayer, a second protective sublayer, and a third protective sublayer; the three sublayers are stacked. Wherein, the materials of the first protective sublayer and the third protective sublayer are metal oxide semiconductors, the oxygen content of the first protective sublayer and the third protective sublayer is greater than the oxygen content of the metal oxide semiconductor active layer 130, and the material of the second protective sublayer is an inorganic material. Preferably, the third protective layer may adopt a sandwich structure of high oxygen content metal oxide/inorganic silicon oxide/high oxygen content metal oxide; that is, the first protective sublayer and the third protective sublayer are both metal oxide semiconductors with high oxygen content, the oxygen content of the first protective sublayer and the third protective sublayer is higher than the oxygen content of the metal oxide semiconductor active layer 130, and the second protective sublayer is made of inorganic materials, such as inorganic silicon oxide, silicon nitride, etc. The metal oxide semiconductor in the third protective layer 230 can absorb external light to reduce the light irradiated to the second protective layer 220; therefore, there is very little light that can reach the metal oxide semiconductor active layer 130 after passing through the three protective layers, so as to significantly reduce the impact of light on the metal oxide semiconductor active layer 130 and to enhance the protection of the metal oxide semiconductor active layer 130.

Specifically, a passivation layer 180 is further provided on the side of the second protection layer 220 away from the substrate 100. The film material of the passivation layer 180 can be silicon oxide (SiOx), silicon nitride/silicon oxide stack (SiNx/SiOx), or a stack of silicon oxide (SiOx), oxynitride (SiNx) and aluminum oxide ($Al_2O_3$).

Wherein, a pixel electrode layer 190 is provided on the side of the third protection layer 230 away from the substrate. The film material of the pixel electrode layer 190 may be a high-transmittance metal oxide material such as indium tin oxide (ITO) or indium zinc oxide (IZO) and could be patterned to form an anode pad, so that display elements such as OLED or Mini/Micro-LED can be formed or disposed on the pad.

In an embodiment, among the first protective layer, the second protective layer, and the third protective layer, the band gap or energy gap of the metal oxide semiconductor of at least one of the protective layers is 2.0 eV to 3.5 eV. Since metal oxides such with high mobility generally have a band gap of less than 2.0 eV, they are more sensitive to light and are likely to cause device negative drift. In this application, a metal oxide semiconductor with a band gap of 2.0 eV-3.5 eV is used as a protective layer to absorb the optical fiber reflected by the grid, LED, etc. and to reduce the external light and the influence of the light on the metal oxide semiconductor active layer 130.

Preferably, among the aforementioned first protective layer, second protective layer and third protective layer, the sheet resistance of the metal oxide semiconductor of at least one protective layer is equal to or more 10 to the power of 9 ($10^9$) $\Omega \cdot cm^{-2}$.

Preferably, among the aforementioned first protective layer, second protective layer and third protective layer, the thickness of the metal oxide semiconductor of at least one protective layer is 10 nm to 30 nm.

Preferably, among the aforementioned first protective layer, second protective layer and third protective layer, the metal oxide semiconductor of at least one protective layer is an opaque material.

Preferably, among the aforementioned first protective layer, second protective layer and third protective layer, the material of the metal oxide semiconductor of each protective layer includes one or more of indium gallium zinc oxide (IGZO), indium zinc tin oxide (IZTO), and indium gallium zinc tin oxide (IGZTO).

It should be noted that the driver board architecture of the present application is not limited to 2T1C circuits and other current drive circuits including switches and driving TFTs, and can be applied to products such as OLED, Mini/Micro-LED, etc.

At the same time, the present application also provides a method for preparing a driver board, the specific steps include: Step 1: Provide substrate; Step 2: preparing a metal oxide semiconductor active layer on the substrate; Step 3: preparing a gate layer on the metal oxide semiconductor active layer, and the gate layer is arranged on the side of the metal oxide semiconductor active layer away from the substrate; Step 4: preparing a first protective layer on the gate layer; wherein the first protective layer covers the gate layer, the material of the first protective layer is a metal oxide semiconductor, and the oxygen content of the first protective layer is greater than the oxygen content of the metal oxide semiconductor active layer.

The method will be described in detail below with reference to FIGS. 3 to 9.

Figure 3:
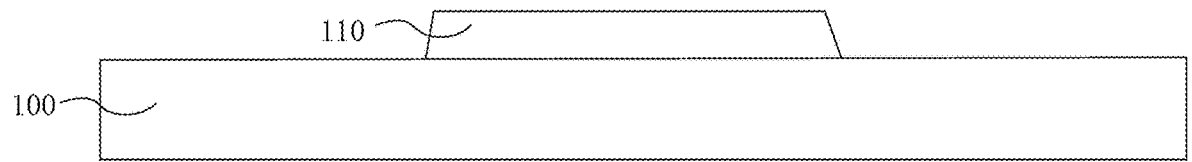
FIG. 3 is a schematic diagram of the first stage of the manufacturing method of the driver board provided by the embodiment of the application.

In Step 1, as shown in FIG. 3, a substrate 100 is provided. A first metal layer is deposited on the substrate 100 by physical vapor sputtering; wherein the first metal layer includes one or more alloys of molybdenum (Mo), aluminum (Al), copper (Cu), and titanium (Ti), and also includes molybdenum/copper laminate (Mo/Cu), molybdenum-titanium alloy/Copper laminate (MoTi/Cu), etc.; and the first metal layer is patterned to form a light-shielding layer 110.

Figure 4:
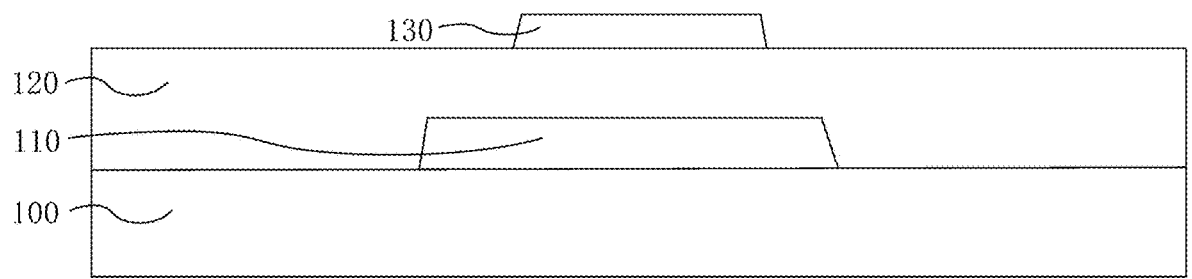
FIG. 4 is a schematic diagram of the second stage of the manufacturing method of the driver board provided by the embodiment of the application.

In Step 2, as shown in FIG. 4, a metal oxide semiconductor active layer 130 is prepared on the substrate 100. First, a buffer layer 120 is forming by chemical vapor deposition on one side of the substrate 100 with a high-temperature annealing treatment for 2-3 hours at a temperature of 300-400° C.; wherein, the material of the buffer layer 120 may be inorganic materials such as silicon oxide (SiOx), silicon nitride (SiNx), silicon oxynitride (SiON), or silicon nitride/silicon oxide stack (SiNx/SiOx), subsequently, a high-mobility metal oxide material is deposited and patterned to form a metal oxide semiconductor active layer 130 on the buffer layer 120; wherein, high-mobility oxide materials include, but not limited, indium gallium zinc oxide (IGZO), indium zinc tin oxide (IZTO), and indium gallium zinc tin oxide (IGZTO).

Figure 5:
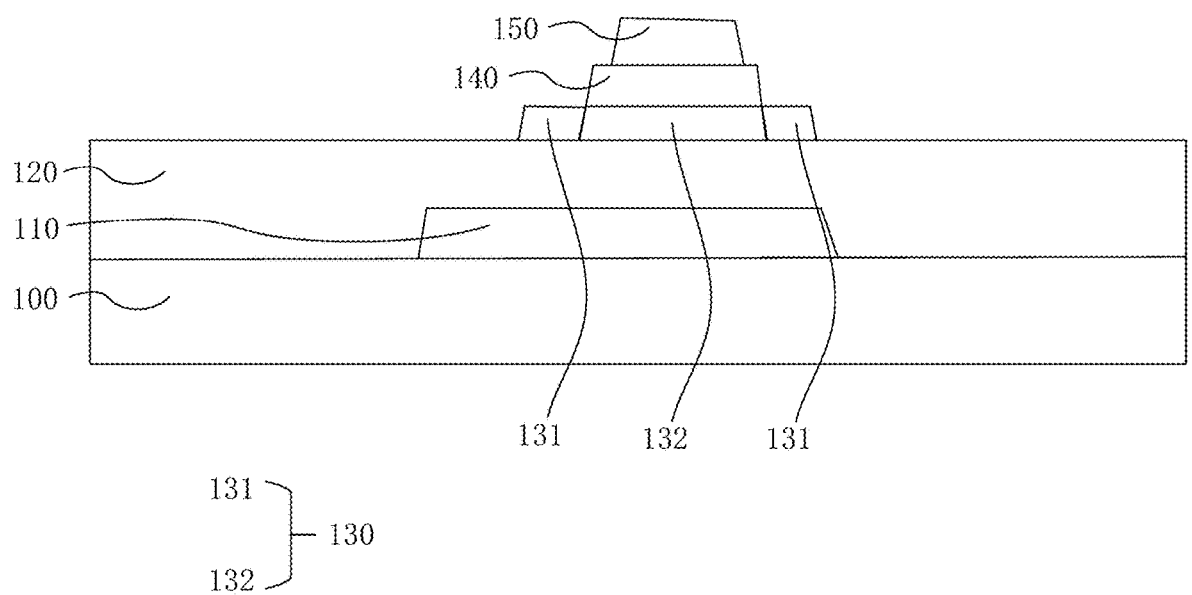
FIG. 5 is a schematic diagram of the third stage of the manufacturing method of the driver board provided by the embodiment of the application.

In Step 3, as shown in FIG. 5, a gate layer 150 is prepared on the metal oxide semiconductor active layer 130; the gate layer 150 is arranged on the side of the metal oxide semiconductor active layer 130 away from the substrate. The gate insulating layer 140 is formed on the metal oxide semiconductor active layer 130, and the material of the gate insulating layer 140 may be an inorganic material such as silicon oxide and silicon nitride.

The gate layer 150 is formed on the gate insulating layer 140, and the gate insulating layer 140 and the light shielding layer 110 are continuously deposited to pattern the gate layer 150 to form the top gate and scan lines; then, the top gate self-alignment process is used to complete the patterning of the gate insulating layer 140, and finally the region of the metal oxide semiconductor active layer 130 is treated with plasma to form the doped region 131 and the channel region 132 of the thin film transistor respectively; wherein, the doped region 131 is the region where the metal oxide semiconductor active layer 130 is conductive. The material of the gate layer 150 includes one or more alloys of molybdenum (Mo), aluminum (Al), copper (Cu), and titanium (Ti), and the material is not specifically limited herein.

Figure 6:
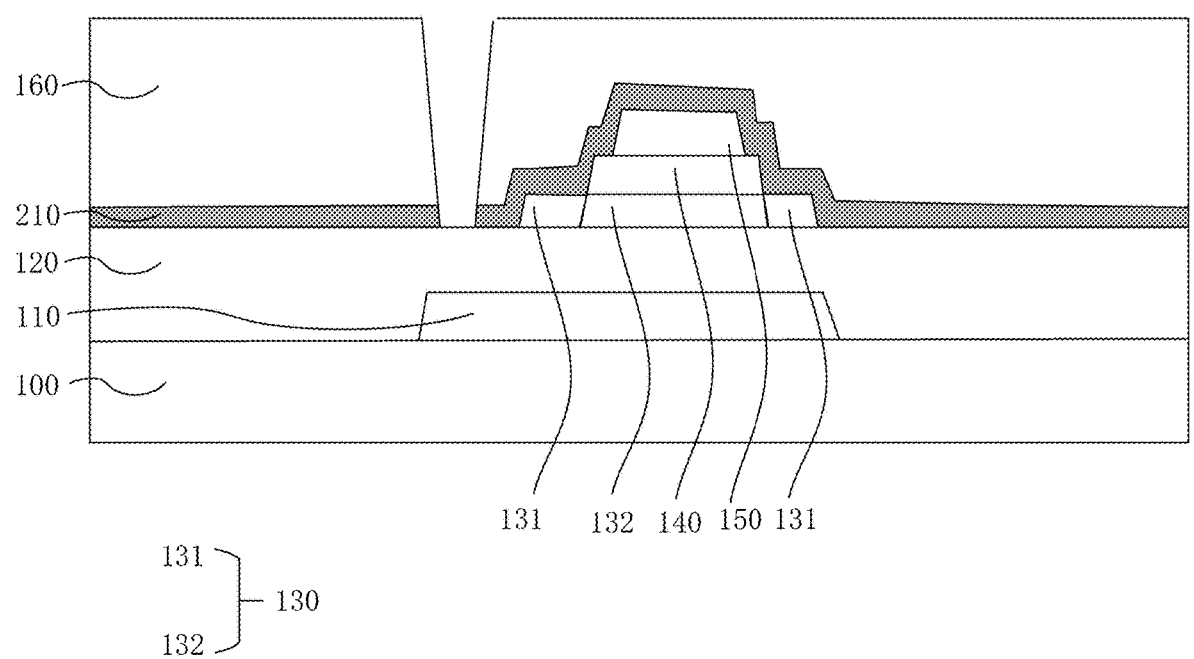
FIG. 6 is a schematic diagram of the fourth stage of the manufacturing method of the driver board provided by the embodiment of the application.

In Step 4, as shown in FIG. 6, a first protective layer 210 is formed on the gate layer 150, covering the gate layer 150. The material of the first protective layer 210 is a metal oxide semiconductor, and the oxygen content of the first protective layer 210 is greater than the oxygen content of the metal oxide semiconductor active layer 130.

After the gate layer 150 is patterned, a thinner layer of metal oxide semiconductor material with higher oxygen content is sputtered on the pattern as the first protective layer 210 of the semiconductor channel. The first protective layer 210 has compact characteristics because its material is a metal oxide semiconductor, so as to block the penetration of water vapor in the environment, to absorb part of the light reflected by the gate, and to reduce the influence of external light on the channel.

The interlayer insulating layer 160 is formed on the first protective layer 210 by chemical vapor deposition to form a pattern of the interlayer insulating layer. Wherein, the film material of the interlayer insulating layer 160 can be SiOx, or SiOx/SiNx laminate As shown in FIG. 7, based on the structure of FIG. 6, the chemical vapor deposition of the interlayer insulating layer 160 is continued to pattern the interlayer dielectric layer pattern.

Figure 7:
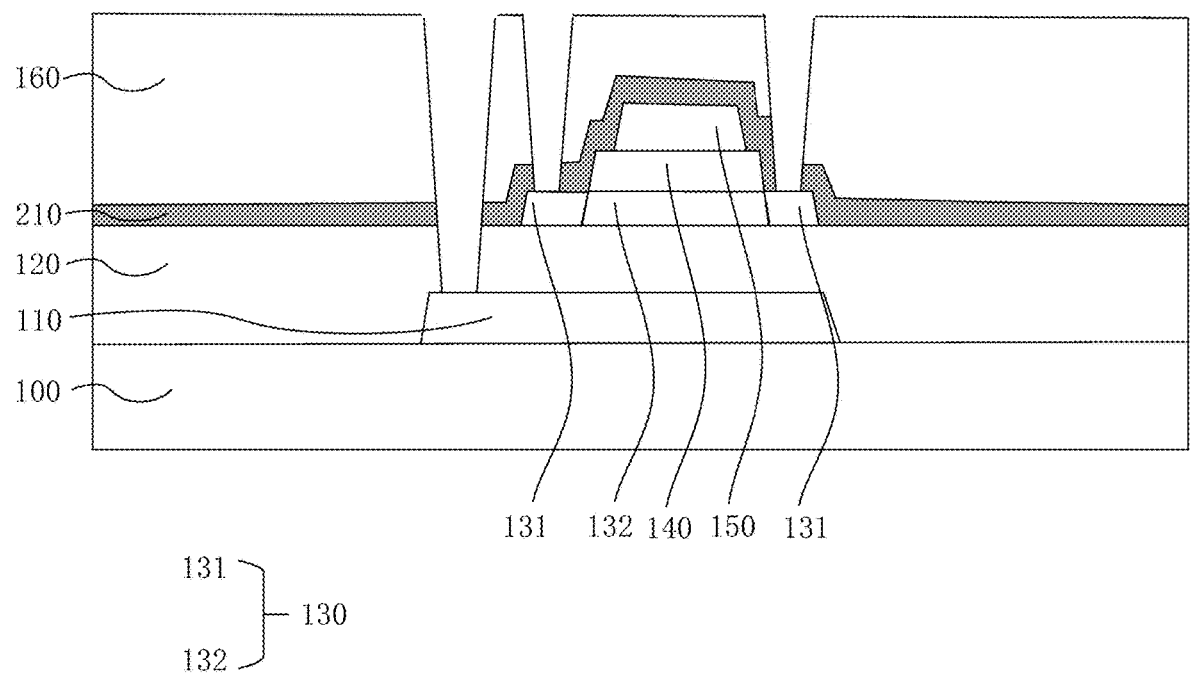
FIG. 7 is a schematic diagram of the fifth stage of the manufacturing method of the driver board provided by the embodiment of the application.
Figure 8:
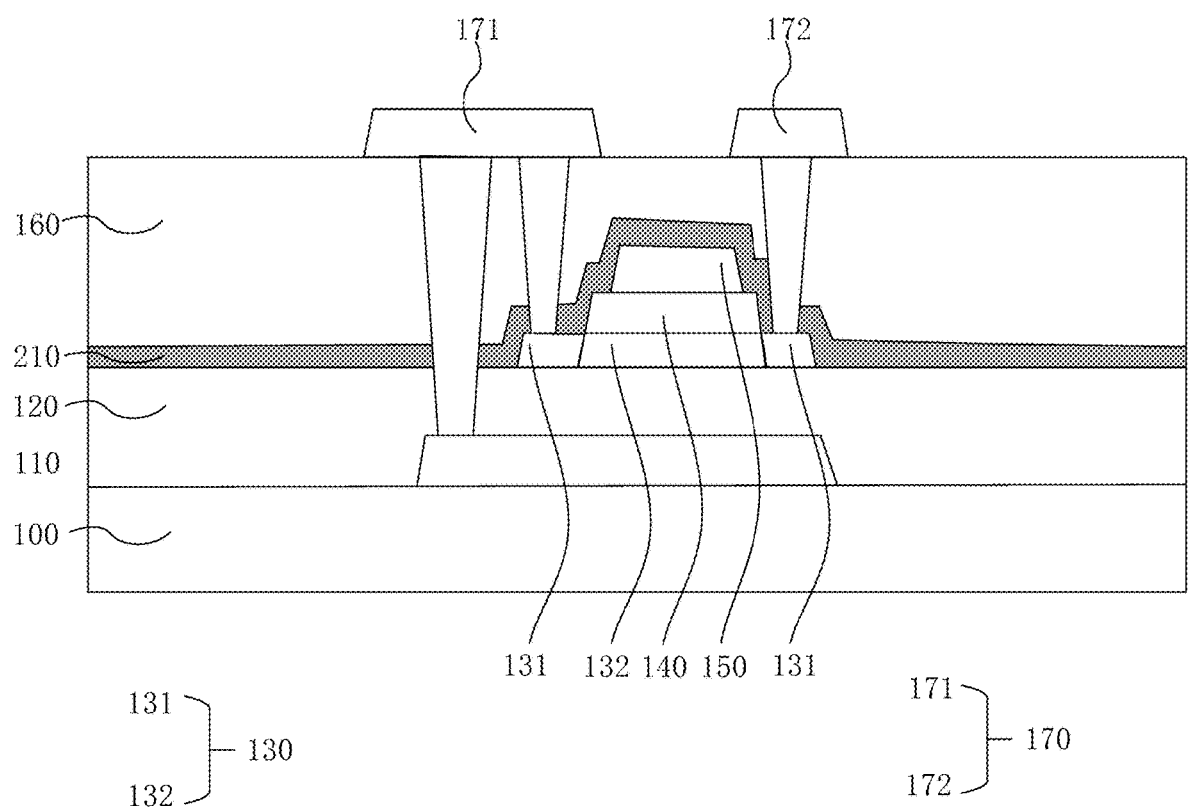
FIG. 8 is a schematic diagram of the sixth stage of the manufacturing method of the driver board provided by the embodiment of the application.

As shown in FIG. 8, on the basis of the structure of FIG. 7, the interlayer insulating layer 160 and the buffer layer 120 are further patterned to facilitate the subsequent overlap of the source electrode 171 and the doped region 131. The source-drain layer 170 is deposited on the interlayer insulating layer 160 by physical vapor deposition, and then the source-drain layer 170 is patterned to form the source electrode 171 and the drain electrode 172. Wherein, the source-drain layer 170 may be made of molybdenum (Mo), molybdenum/copper laminate (Mo/Cu), molybdenum titanium alloy/copper laminate (MoTi/Cu), etc.

Figure 9:
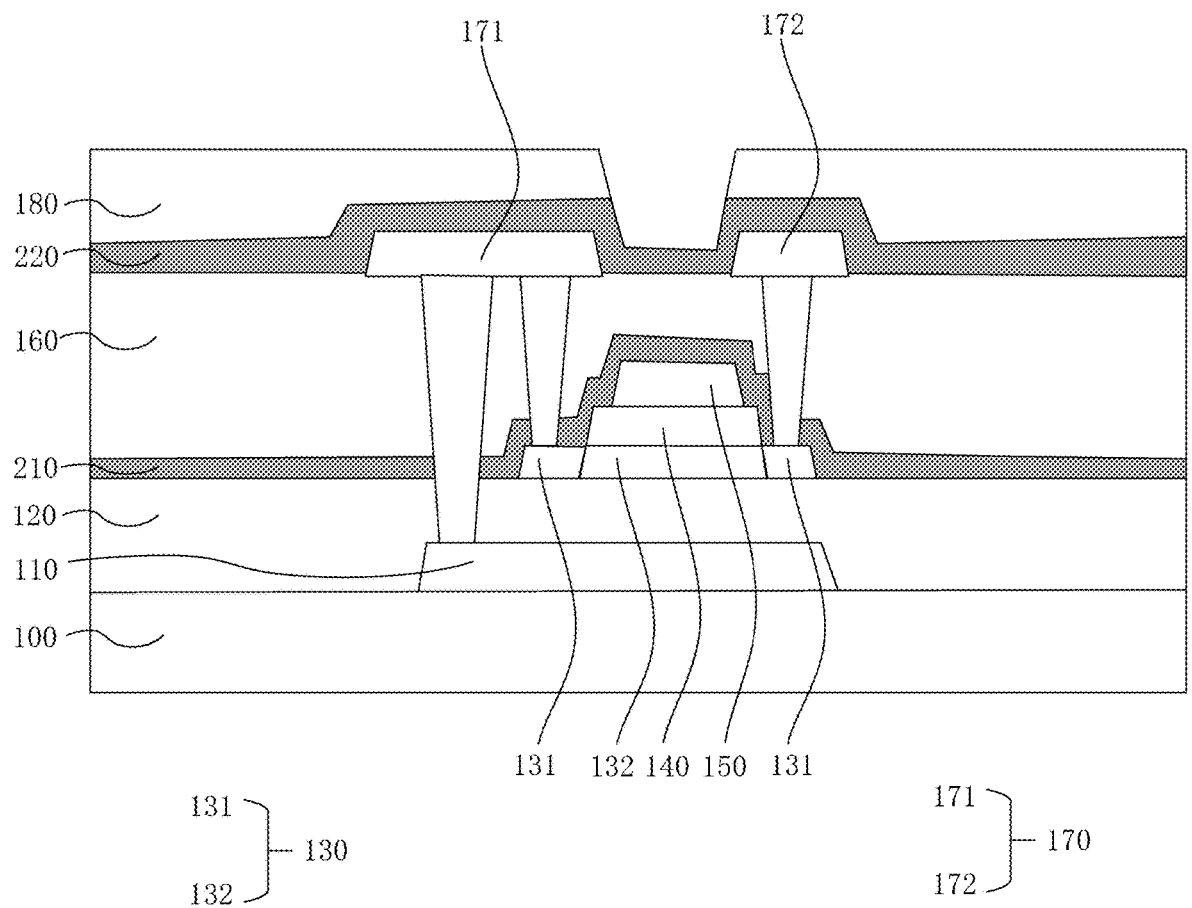
FIG. 9 is a schematic diagram of the seventh stage of the manufacturing method of the driver board provided by the embodiment of the application.

As shown in FIG. 9, a second protection layer 220 is formed on the source-drain layer 170. Wherein, the material of the second protection layer 220 is a metal oxide semiconductor, and the oxygen content of the second protective layer 220 is greater than the oxygen content of the metal oxide semiconductor active layer 130.

Specifically, a thin layer of metal oxide semiconductor material with high oxygen content is covered on the source-rain layer 170 as the second protection layer 220 of the source-drain layer 170. The second protective layer is a metal oxide semiconductor and has compact characteristics, so as to block the penetration of water vapor in the environment, to avoid corroding the metal of the source and drain layers, and to absorb part of the light reflected by the LED and the components that significantly influences the oxide.

The passivation layer 180 is formed on the second protection layer 220; subsequently, the passivation layer 180 is continuously deposited and patterned.

The pixel electrode layer 190 is formed on the passivation layer 180, and then the pixel electrode layer 190 is coated and patterned into an anode pad, so that display elements such as OLED or Mini/Micro-LED can be used on the pad. Wherein the coating material can be high permeability metal oxide materials such as indium tin oxide (ITO) or indium zinc oxide (IZO).

After the above process, a double-layer metal oxide semiconductor structure as shown in FIG. 1 is formed, and each layer structure in the double-layer metal oxide semiconductor has been described above, and will not be repeated here.

Preferably, as shown in FIG. 2, a third protective layer 230 is formed on the passivation layer 180; wherein the oxygen content of the third protective layer 230 is greater than the oxygen content of the metal oxide semiconductor active layer 130.

Wherein, the third protective layer 230 includes a first protective sublayer, a second protective sublayer, and a third protective sublayer that are stacked; the materials of the first protective sublayer and the third protective sublayer are metal oxide semiconductors; the oxygen content of the first protective sublayer and the third protective sublayer is greater than the oxygen content of the metal oxide semiconductor active layer 130; and the material of the second protective sublayer is an inorganic material. For example, the third protective layer 230 may be a sandwich structure of high oxygen content metal oxide/inorganic silicon oxide/high oxygen content metal oxide.

Subsequently, the passivation layer 180 and the third protective layer 230 are continuously deposited and patterned. The pixel electrode layer 190 is formed on the third protective layer 230 and is patterned to form an anode Pad, so as to form an OLED or Mini/Micro-LED display element on the Pad. Wherein, the film material of the pixel electrode layer 190 may be a high-transmittance metal oxide material such as indium tin oxide (ITO) or indium zinc oxide (IZO).

After the above process, a three-layer metal oxide semiconductor structure as shown in FIG. 2 is formed, and each layer structure in the three-layer metal oxide semiconductor has been described above, so will not be repeated here.

The application also provides a display panel, including a driver board and a light source. Wherein, the driver board is the driver board described in any of the above embodiments, and the display panel may be an OLED or Mini/Micro-LED display panel.

According to the above embodiments, the application provides a driver board and a display panel; the driver board includes a substrate, a metal oxide semiconductor active layer, a gate layer and a first protective layer. Wherein, the gate layer is arranged on the side of the metal oxide semiconductor active layer away from the substrate; the first protective layer covers the gate layer; and the oxygen content of the first protective layer is greater than the oxygen content of the metal oxide semiconductor active layer. The driver board of the present application is provided with a first protective layer; wherein the material of the first protective layer is a metal oxide semiconductor with dense properties as a water vapor barrier layer of the metal oxide semiconductor, so as to effectively prevent water vapor in the environment from penetrating through the inorganic film in the driver board; moreover, the oxygen content of the first protective layer is greater than the oxygen content of the metal oxide semiconductor active layer, so as to further ensure the insulation characteristics of the first protective layer, to reduce the device negative drift, and to improve the transistor performance.

In the above embodiments, the description of each embodiment has its own focus. For parts that are not described in detail in a certain embodiment, please refer to related descriptions of other embodiments. The driver board and the display panel provided by the embodiments of the present application are described in detail above; in this article, specific examples are used to explain the principles and implementation of this application; and the descriptions of the above embodiments are only used to help understand the technical solutions and core ideas of this application.

Those of ordinary skill in the art should understand that it is possible to modify the technical solutions recorded in the foregoing embodiments, or equivalently replace some of the technical features; however, these modifications or replacements do not cause the essence of the corresponding technical solutions to deviate from the scope of the technical solutions of the embodiments of the present application.

What is claimed is:

1. A driver board, comprising:
   a substrate;
   a metal oxide semiconductor active layer;
   a gate layer, arranged on the side of the metal oxide semiconductor active layer away from the substrate;
   a first protective layer, covered the gate layer, wherein the material of the first protective layer is metal oxide semiconductor, and the oxygen content of the first protective layer is greater than the oxygen content of the metal oxide semiconductor active layer;
   a source-drain layer and a second protective layer, wherein the source-drain layer is arranged on the side of the first protection layer away from the gate layer, the second protective layer covers the source-drain layer, the material of the second protective layer is metal oxide semiconductor, and the oxygen content of the second protective layer is greater than the oxygen content of the metal oxide semiconductor active layer; and
   a third protective layer and a passivation layer, wherein the passivation layer is arranged on the side of the second protection layer away from the source-drain layers, the third protective layer covers the passivation layer, and the oxygen content of the third protective layer is greater than the oxygen content of the metal oxide semiconductor active layer,
   wherein the third protective layer comprises a first protective sublayer, a second protective sublayer, and a third protective sublayer that are stacked, wherein the materials of the first protective sublayer and the third protective sublayer are metal oxide semiconductors, the oxygen content of the first protective sublayer and the third protective sublayer is greater than the oxygen content of the metal oxide semiconductor active layer, and the material of the second protective sublayer is an inorganic material.

2. The driver board according to claim 1, wherein the band gap of the metal oxide semiconductor of the at least one protective layer is 2.0 eV to 3.5 eV.

3. The driver board according to claim 1, wherein the sheet resistance of the metal oxide semiconductor of at least one protective layer is equal to or more than 10 to the power of 9 ($10^9$) $\Omega \cdot cm^{-2}$.

4. The driver board according to claim 1, wherein the thickness of the metal oxide semiconductor of at least one protective layer is 10 nm to 30 nm.

5. The driver board according to claim 1, wherein the metal oxide semiconductor of at least one protective layer is an opaque material.

6. The driver board according to claim 1, wherein the material of the metal oxide semiconductor of each protective layer includes one or more of indium gallium zinc oxide, indium zinc tin oxide, and indium gallium zinc tin oxide.

7. The driver board according to claim 1, wherein a pixel electrode layer is arranged on the side of the passivation layer away from the substrate, and the film material of the pixel electrode layer is a high-permeability metal oxide material.

8. A display panel, comprising a driver board and a light source, the driver board further comprises:
   a substrate;
   a metal oxide semiconductor active layer;
   a gate layer, arranged on the side of the metal oxide semiconductor active layer away from the substrate;
   a first protective layer, covered the gate layer, wherein the material of the first protective layer is metal oxide semiconductor, and the oxygen content of the first protective layer is greater than the oxygen content of the metal oxide semiconductor active layer;

a source-drain layer and a second protective layer, wherein the source-drain layer is arranged on the side of the first protection layer away from the gate layer, the second protective layer covers the source-drain layer, the material of the second protective layer is metal oxide semiconductor, and the oxygen content of the second protective layer is greater than the oxygen content of the metal oxide semiconductor active layer; and a third protective layer and a passivation layer, wherein the passivation layer is arranged on the side of the second protection layer away from the source-drain layers, the third protective layer covers the passivation layer, and the oxygen content of the third protective layer is greater than the oxygen content of the metal oxide semiconductor active layer, wherein the third protective layer comprises a first protective sublayer, a second protective sublayer, and a third protective sublayer that are stacked, wherein the materials of the first protective sublayer and the third protective sublayer are metal oxide semiconductors, the oxygen content of the first protective sublayer and the third protective sublayer is greater than the oxygen content of the metal oxide semiconductor active layer, and the material of the second protective sublayer is an inorganic material.

9. The display panel according to claim 8, wherein the band gap of the metal oxide semiconductor of the at least one protective layer is 2.0 eV to 3.5 eV.

10. The display panel according to claim 8, wherein the sheet resistance of the metal oxide semiconductor of at least one protective layer is equal to or more than 10 to the power of 9 ($10^9$) $\Omega \cdot cm^{-2}$.

11. The display panel according to claim 8, wherein the thickness of the metal oxide semiconductor of at least one protective layer is 10 nm to 30 nm.

12. The display panel according to claim 8, wherein the metal oxide semiconductor of at least one protective layer is an opaque material.

13. The display panel according to claim 8, wherein the material of the metal oxide semiconductor of each protective layer includes one or more of indium gallium zinc oxide, indium zinc tin oxide, and indium gallium zinc tin oxide.

14. The display panel according to claim 8, wherein a pixel electrode layer is arranged on the side of the passivation layer away from the substrate, and the film material of the pixel electrode layer is a high-permeability metal oxide material.

* * * * *